(12) United States Patent
Takao et al.

(10) Patent No.: US 9,881,912 B2
(45) Date of Patent: Jan. 30, 2018

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Kazuto Takao, Tsukuba (JP); Shinya Kyogoku, Nagareyama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 53 days.

(21) Appl. No.: 15/062,421

(22) Filed: Mar. 7, 2016

(65) Prior Publication Data

US 2016/0284683 A1 Sep. 29, 2016

(30) Foreign Application Priority Data

Mar. 24, 2015 (JP) ................................ 2015-060239
Dec. 7, 2015 (JP) ................................ 2015-238929

(51) Int. Cl.
| | |
|---|---|
| *H01L 27/02* | (2006.01) |
| *H01L 29/16* | (2006.01) |
| *H01L 29/78* | (2006.01) |
| *H02K 11/33* | (2016.01) |
| *H02M 7/00* | (2006.01) |

(52) U.S. Cl.
CPC ...... *H01L 27/0251* (2013.01); *H01L 27/0292* (2013.01); *H01L 29/1608* (2013.01); *H01L 29/7805* (2013.01); *H01L 29/7813* (2013.01); *H02K 11/33* (2016.01); *H02M 7/003* (2013.01)

(58) Field of Classification Search
CPC ............ H01L 27/0251; H01L 27/0629; H01L 27/0658; H01L 29/1608; H01L 29/7805; H01L 29/7813; H01L 29/7397; H02M 7/533
See application file for complete search history.

(56) References Cited

U.S. PATENT DOCUMENTS

| | | | |
|---|---|---|---|
| 5,604,670 A | * | 2/1997 | Sonoda ............. H02M 7/53803 363/50 |
| 6,028,779 A | | 2/2000 | Sakamoto et al. |
| 6,449,181 B1 | | 9/2002 | Rieger et al. |
| 6,943,445 B2 | | 9/2005 | Shirakawa et al. |
| 8,637,964 B2 | | 1/2014 | Jones et al. |
| 2014/0084993 A1 | | 3/2014 | Takao et al. |

(Continued)

FOREIGN PATENT DOCUMENTS

| | | |
|---|---|---|
| JP | 11-1 55286 | 6/1999 |
| JP | 2005-5593 | 1/2005 |
| JP | 2007-234690 | 9/2007 |

(Continued)

*Primary Examiner* — Mark Prenty
(74) *Attorney, Agent, or Firm* — Oblon, McClelland, Maier & Neustadt, L.L.P.

(57) ABSTRACT

A semiconductor device according to an embodiment includes a plurality of circuit units, and each of the circuit units includes, a first electrode, a second electrode; a first switching element and a second switching element electrically connected in series between the first electrode and the second electrode, and a third electrode electrically connected between the first switching element and the second switching element. The circuit units are arranged in an annular shape.

14 Claims, 11 Drawing Sheets

(56) References Cited

U.S. PATENT DOCUMENTS

2014/0345492 A1* 11/2014 Fujito .................... H02P 27/06
 105/61
2015/0155276 A1 6/2015 Takao et al.

FOREIGN PATENT DOCUMENTS

| JP | 4727882 | 7/2011 |
| JP | 2014-67760 | 4/2014 |
| JP | 2015-19110 | 1/2015 |
| JP | 2015-106646 | 6/2015 |

* cited by examiner

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2015-060239, filed on Mar. 24, 2015, and Japanese Patent Application No. 2015-238929, filed on Dec. 7, 2015, the entire contents of which are incorporated herein by reference.

FIELD

Embodiments described herein relate generally to a semiconductor device, an inverter circuit, a driving device, a vehicle, and an elevator.

BACKGROUND

For example, in a power semiconductor module such as a power conversion module, there may be a problem that the faster switching operation is, the more likely breakdown of a device and noise generation may be caused by overvoltage during turn-off time. The overvoltage during the turn-off time is proportional to a time change rate between inductance inside circuit wiring and current flowing in the power semiconductor module (di/dt).

When a switching time is taken long in order to suppress overvoltage, switching operation becomes slow. Simultaneously, a switching loss represented by time integration of a product of current and voltage is increased. In order to suppress overvoltage and further reduce the switching loss, it is desirable to reduce inductance of the power semiconductor module.

There is a method to divide the power semiconductor module into a plurality of circuit units in order to reduce inductance. In this case, improving uniformity of current distribution between the plurality of circuit units is desirable from the viewpoint of designing the power semiconductor module.

DETAILED DESCRIPTION

A semiconductor device according to an embodiment includes a plurality of circuit units, each of the circuit units including, a first electrode, a second electrode, a first switching element and a second switching element electrically connected in series between the first electrode and the second electrode, and a third electrode electrically connected between the first switching element and the second switching element. The circuit units are arranged in an annular shape.

Embodiments of the present disclosure will be described below with reference to the drawings. In the following description, note that a same component or the like will be denoted by a same reference sign, and a description for a component or the like once described will be suitably omitted.

First Embodiment

A semiconductor device according to the present embodiment includes a plurality of circuit units, and each of the circuit units includes: a first electrode, a second electrode, a first switching element and a second switching element electrically connected in series between the first electrode and the second electrode, and a third electrode electrically connected between the first switching element and the second switching element, and the circuit units are arranged in an annular shape.

Figure 1:
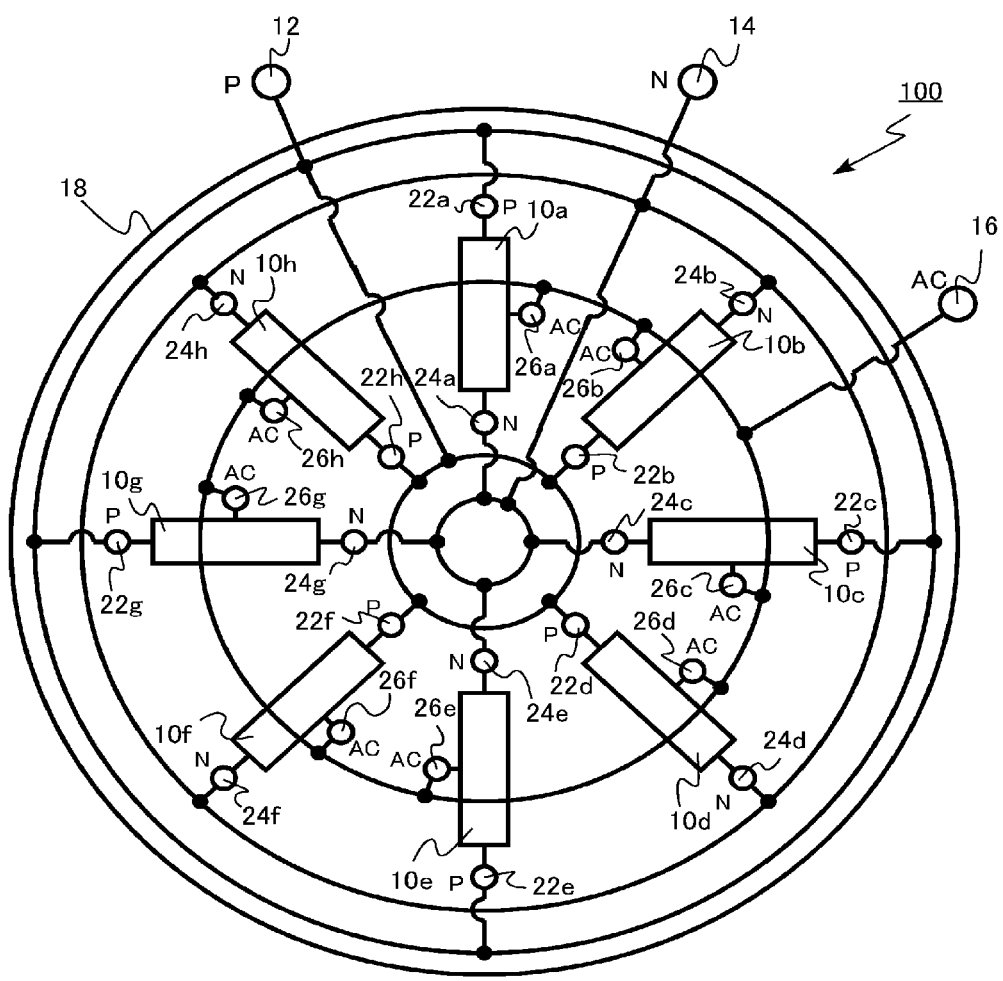
FIG. 1 is a schematic plan view illustrating a semiconductor device according to a first embodiment.

FIG. 1 is a schematic plan view illustrating the semiconductor device according to the present embodiment. The semiconductor device according to the present embodiment is a semiconductor module used in an inverter circuit.

The semiconductor module 100 includes a plurality of circuit units 10a to 10h, a first main electrode 12, a second main electrode 14, and a main AC electrode 16, and a substrate 18. Further, the circuit units 10a to 10h include first electrodes 22a to 22h, second electrodes 24a to 24h, and AC electrodes (third electrodes) 26a to 26h respectively. Furthermore, the circuit units 10a to 10h respectively include gate signal terminals not illustrated.

The substrate 18 is formed of, for example, an insulator. The circuit units 10a to 10h are arranged on the substrate 18 in an annular shape. The circuit units 10a to 10h are arranged in a manner such that directions to respectively connect the first electrodes 22a to 22h to the second electrodes 24a to 24h of the respective circuit units 10a to 10h become radial. In other words, the circuit units 10a to 10h are arranged in a circle shape.

Further, in two of the circuit units adjacent to each other, the first electrode and the second electrode are adjacent to each other and the second electrode and the first electrode are adjacent to each other. For example, attention is focused on the circuit unit 10a and the circuit unit 10b adjacent to each other. The first electrode 22a of the circuit unit 10a and the second electrode 24b of the circuit unit 10b are adjacent to each other. Further, the second electrode 24a of the circuit unit 10a and the first electrode 22b of the circuit unit 10b are adjacent to each other. The situation is similar in other two of the circuit units adjacent to each other.

The first electrodes 22a to 22h are connected to the first main electrode 12, and applied with common potential. The second electrodes 24a to 24h are connected to the second main electrode 14, and applied with common potential. The circuit units 10a to 10h are connected in parallel between the first main electrode 12 and the second main electrode 14.

The second main electrode 14 is applied with the potential lower than potential applied to the first main electrode 12. Therefore, the second electrodes 24a to 24h are applied with potential lower than potential applied to the first electrodes 22a to 22h.

The first main electrode 12 is applied with positive potential. The second main electrode 14 is grounded or applied with negative potential.

The AC electrodes 26a to 26h of the circuit units 10a to 10h are mutually connected. The AC electrodes 26a to 26h are connected to the main AC electrode 16. The main AC electrode 16 is an output terminal of AC voltage.

Figure 2:
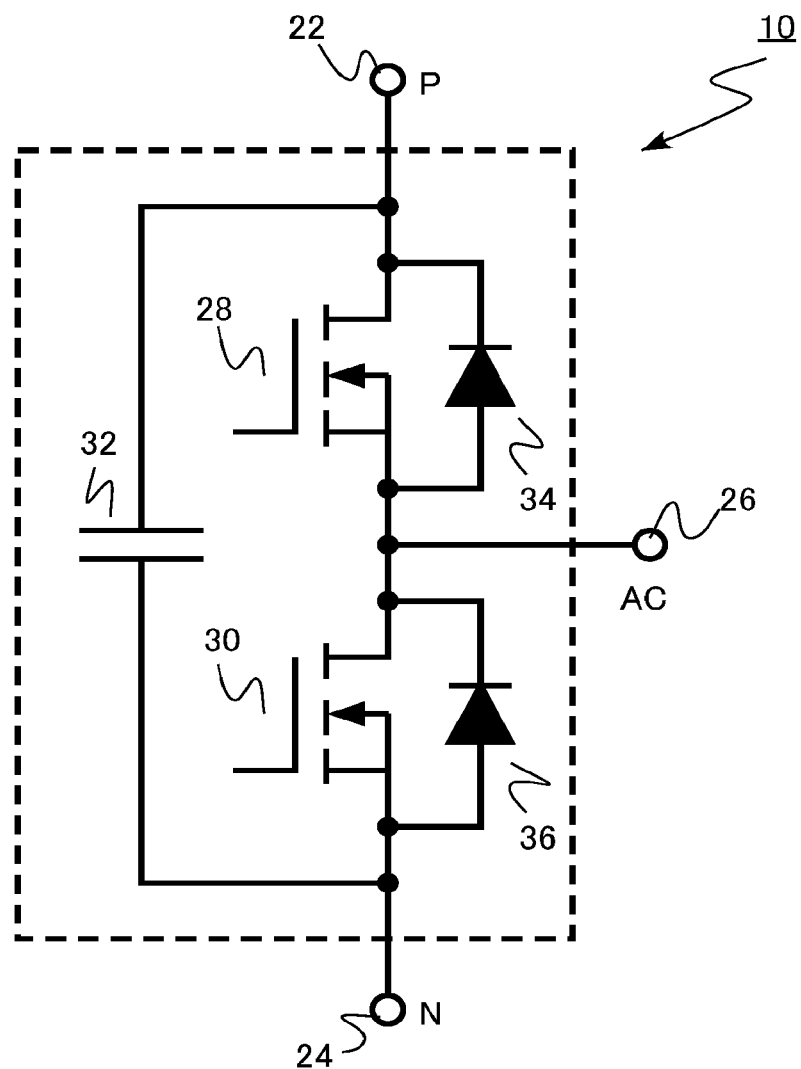
FIG. 2 is a diagram illustrating an equivalent circuit of a circuit unit according to the first embodiment.

FIG. 2 is a diagram illustrating an equivalent circuit of the circuit unit according to the present embodiment. The circuit diagram corresponds to the circuit of each of the circuit units 10a to 10h.

A circuit unit 10 includes a first electrode 22, a second electrode 24, an AC electrode 26, a first switching element 28, a second switching element 30, a capacitor 32, a first diode 34, and a second diode 36.

The first switching element 28 and the second switching element 30 are electrically connected in series between the first electrode 22 and the second electrode 24. The first switching element 28 and the second switching element 30 are, for example, metal oxide semiconductor field effect transistors (MOSFET) of silicon carbide (SiC).

The capacitor 32 is electrically connected between the first electrode 22 and the second electrode 24 in parallel to the first switching element 28 and the second switching element 30.

The first diode 34 is connected in parallel to the first switching element 28. The second diode 36 is connected in parallel to the second switching element 30. The first diode 34 and the second diode 36 are flywheel diodes.

The second main electrode 14 is applied with the potential lower than potential applied to the first main electrode 12. The first main electrode 12 is applied with positive potential. The second main electrode 14 is grounded or applied with negative potential.

The AC electrode 26 is connected between the first switching element 28 and the second switching element 30. AC voltage is output from the AC electrode 26 by controlling gate voltage at the first switching element 28 and the second switching element 30.

Next, function and effects of the semiconductor device according to the present embodiment will be described.

Figure 3:
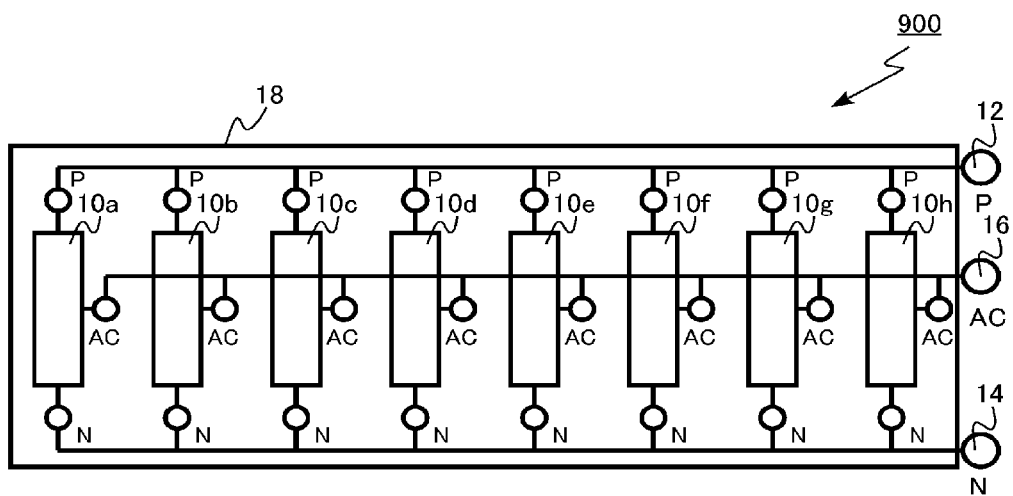
FIG. 3 is a schematic plan view illustrating a semiconductor device according to a comparative embodiment.

FIG. 3 is a schematic plan view illustrating a semiconductor device according to a comparative embodiment. The semiconductor device according to the comparative embodiment is a semiconductor module used in an inverter circuit.

A semiconductor module 900 according to the comparative embodiment differs from the semiconductor module 100 according to the present embodiment in that the plurality of circuit units 10a to 10h is horizontally arranged in an aligned manner on the substrate 18.

The semiconductor module 900 is divided into the plurality of circuit units 10a to 10h, thereby reducing inductance. When mutual inductance between the circuit units 10a to 10h is disregarded, inductance of the semiconductor module 900 is reduced to 1/N by dividing the semiconductor module 900 into N circuit units. According to the comparative embodiment, the number of circuit units is eight. Therefore, inductance is reduced to ⅛.

Accordingly, overvoltage proportional to a time change rate between inductance and current flowing in the power semiconductor module (di/dt) is suppressed during turn-off time. As a result, breakdown of an element and noise generation can be suppressed.

Figure 4:
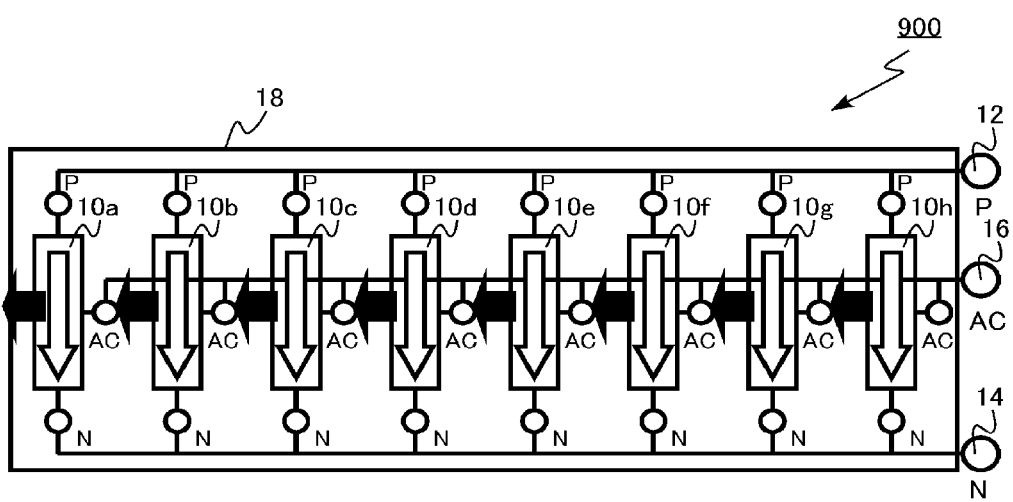
FIG. 4 is a diagram illustrating current directions and magnetic flux directions at the time of operating the semiconductor device according to the comparative embodiment.

FIG. 4 is a diagram illustrating current directions and magnetic flux directions at the time of operating the semiconductor device according to the comparative embodiment. In the diagram, white arrows indicate the current directions and black arrows indicate magnetic flux directions.

As illustrated, the circuit units 10b to 10g excluding the circuit unit 10a and the circuit unit 10h positioned on both ends are each affected by magnetic fluxes of two circuit units located on both sides thereof. However, the circuit unit 10a and the circuit unit 10h positioned on both ends are each affected only by a magnetic flux of one circuit unit adjacent thereto. Therefore, distribution of a magnetic field becomes non-uniform between the circuit units 10a to 10h, and current distribution becomes non-uniform between the circuit units 10a to 10h.

When the current distribution becomes non-uniform between the circuit units 10a to 10h, current in a specific circuit unit becomes higher compared to other circuit units, and it is necessary to take a large design margin relative to rated current of the semiconductor module. Therefore, manufacturing cost of the semiconductor module is increased. Further, heat generation of an element of the circuit unit having large current becomes larger than heat generation of an element of other circuit unit, and reliability is degraded.

Further, in the semiconductor module 900, as illustrated in the diagram, the magnetic flux directions of the circuit units 10a to 10h are same, and mutually strengthened. Therefore, mutual inductance is added to the inductance, and inductance of the semiconductor module 900 is increased.

Figure 5:
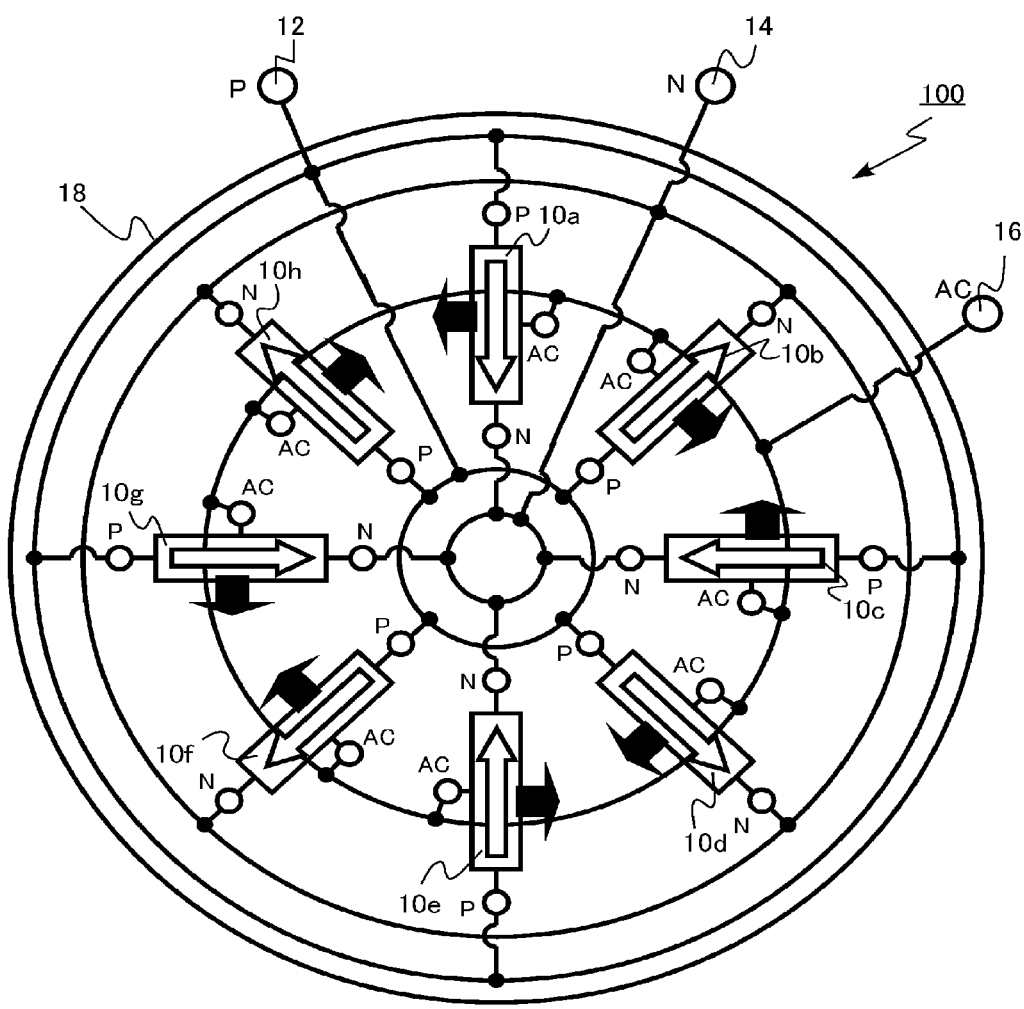
FIG. 5 is a diagram illustrating current directions and magnetic flux directions at the time of operating the semiconductor device according to the first embodiment.

FIG. 5 is a diagram illustrating current directions and magnetic flux directions at the time of operating the semiconductor device according to the present embodiment. In the diagram, white arrows indicate the current directions and black arrows indicate magnetic flux directions.

As illustrated, in the semiconductor module 100, all of the circuit units 10a to 10h are each affected by magnetic fluxes of two circuit units located on both sides thereof in the similar manner. Therefore, uniformity of magnetic field distribution between the circuit units 10a to 10h is improved, and uniformity of current distribution between the circuit units 10a to 10h is improved.

When uniformity of current distribution between the circuit units 10a to 10h is improved, the design margin relative to the rated current of the semiconductor module can be reduced. Therefore, the manufacturing cost of the semiconductor module can be reduced.

The semiconductor module 100 is similar to the semiconductor module 900 according to the comparative embodiment in that inductance is reduced by being divided into the plurality of circuit units 10a to 10h.

Further, as illustrated, the magnetic flux directions of the adjacent circuit units 10a to 10h are opposite in the semiconductor module 100 and cancelled each other. Therefore, the mutual inductance is subtracted from the inductance, and the inductance is further reduced. As a result, breakdown of an element and noise generation can be further suppressed.

According to the present embodiment, uniformity of current distribution between the circuit units is improved and the manufacturing cost of the semiconductor module can be reduced. Further, the inductance is reduced, and breakdown of an element and noise generation can be suppressed.

Note that the number of the circuit units is not limited to eight although the example of having the eight circuit units has been described. As far as the number of the circuit units is an even number equal to four or more, the magnetic flux directions of the adjacent circuit units become opposite and the number of circuit units can be optional.

Figure 6:
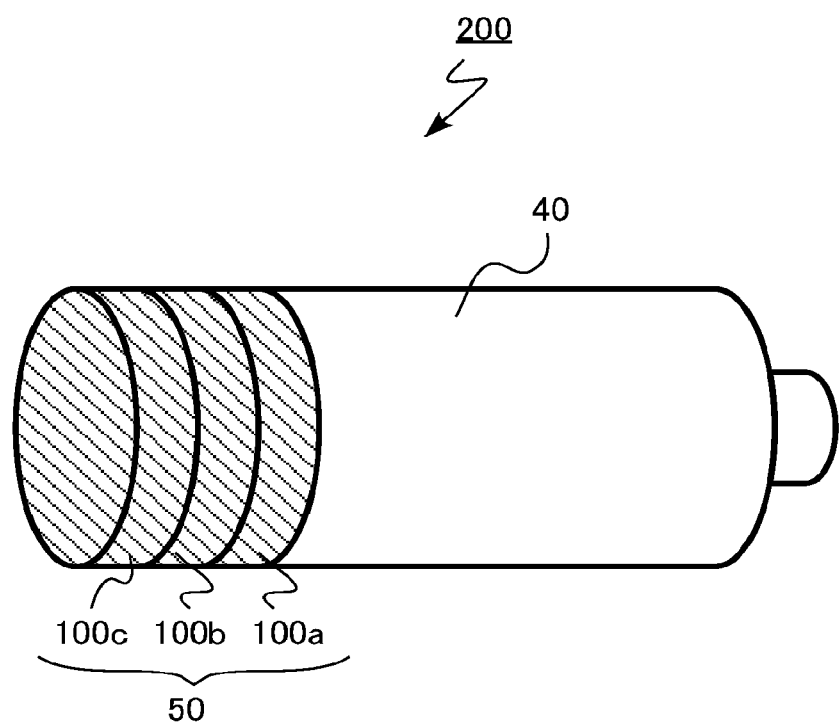
FIG. 6 is a schematic perspective view illustrating a driving device including the semiconductor device according to the first embodiment.

FIG. 6 is a schematic perspective view illustrating a driving device including the semiconductor device according to the present embodiment. The driving device 200 includes a motor 40 and an inverter circuit 50.

The inverter circuit 50 is provided on a back surface of the motor 40. The inverter circuit 50 is formed of three semiconductor modules 100a, 100b, 100c having the same structure as the semiconductor module 100 according to the present embodiment. The three semiconductor modules 100a, 100b, 100c are connected in parallel between the first main electrode and the second main electrode, thereby implementing the three-phase inverter circuit 50 including three AC voltage output terminals U, V, W. The motor 40 is driven by AC voltage output from the inverter circuit 50.

The manufacturing cost can be reduced also in the inverter circuit 50 and the driving device 200. Further, breakdown of an element and noise generation can be suppressed. Furthermore, each of the semiconductor modules 100a, 100b, 100c is arranged in a disk-like shape by arranging the circuit units in a circle shape. Therefore, the semiconductor modules can be provided on the back surface of the motor 40, and the driving device 200 can be downsized.

Second Embodiment

A semiconductor device according to the present embodiment is similar to the first embodiment except for that a first electrode and a first electrode are adjacent to each other and a second electrode and a second electrode are adjacent to each other in two of the adjacent circuit units. Therefore, a description for the matters overlapping with the first embodiment will be partly omitted.

Figure 7:
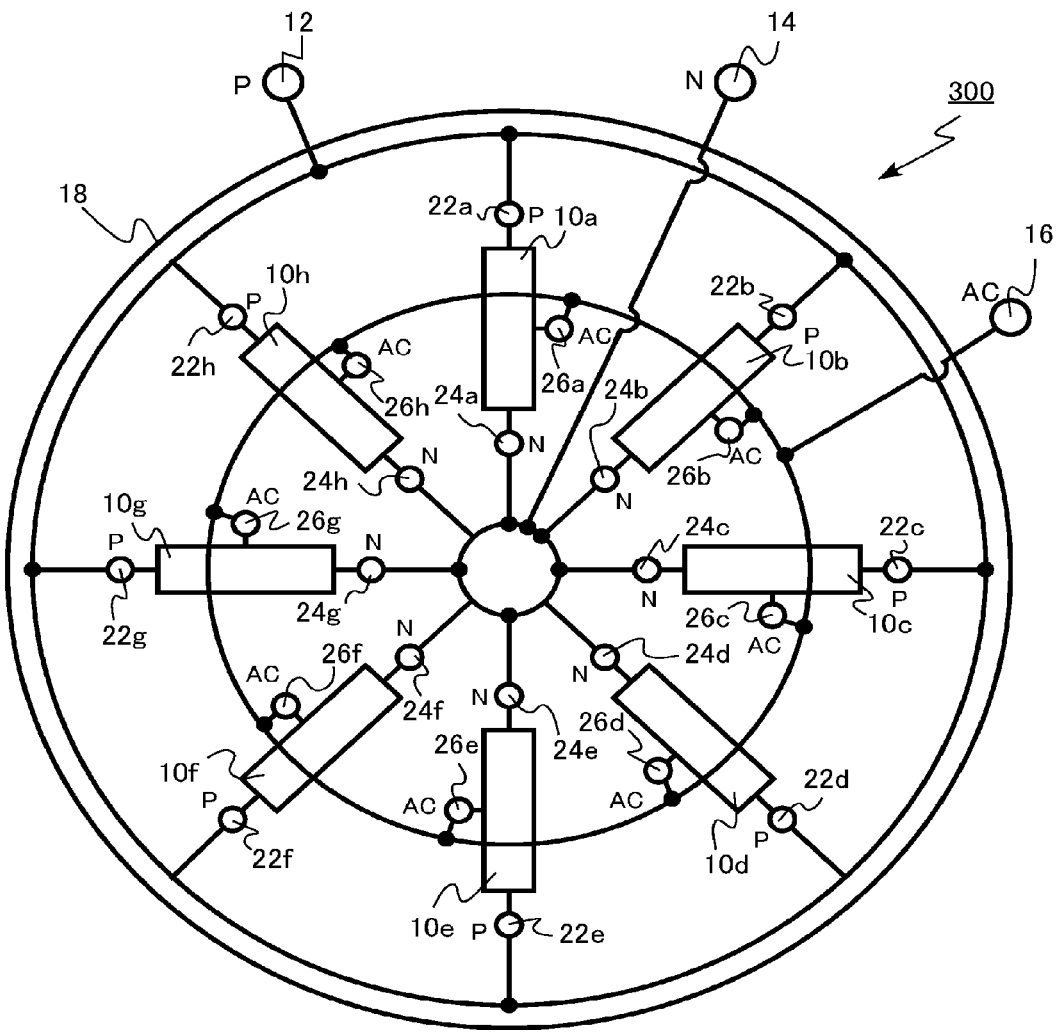
FIG. 7 is a schematic plan view illustrating a semiconductor device according to a second embodiment.

FIG. 7 is a schematic plan view illustrating the semiconductor device according to the present embodiment. The semiconductor device according to the present embodiment is a semiconductor module used in an inverter circuit.

In a semiconductor module 300 according to the present embodiment, the first electrode and the first electrode are adjacent to each other and the second electrode and the second electrode are adjacent to each other in two of the adjacent circuit units. For example, attention is focused on the circuit unit 10a and the circuit unit 10b adjacent to each other. A first electrode 22a of the circuit unit 10a and a first electrode 22b of the circuit unit 10b are adjacent to each other. Further, a second electrode 24a of the circuit unit 10a and a second electrode 24b of the circuit unit 10b are adjacent to each other. The situation is similar in other two of the circuit units adjacent to each other.

The first electrode and the first electrode are adjacent to each other and the second electrode and the second electrode are adjacent to each other in two of the adjacent circuit units. Therefore, wiring to respectively connect the first electrodes 22a to 22h to a first main electrode 12 is simplified. Further, wiring to respectively connect the second electrodes 24a to 24h to a second main electrode 14 is simplified. Therefore, connection between the circuit units 10a to 10h is simplified, and the semiconductor module 300 can be downsized.

According to the present embodiment, uniformity of current distribution between the circuit units is improved and manufacturing cost of the semiconductor module can be reduced similar to the first embodiment. Further, the semiconductor module can be downsized. Moreover, inductance is reduced and breakdown of an element and noise generation can be suppressed by dividing the semiconductor module into the plurality of circuit units.

Note that the number of the circuit units is not limited to eight although the example of having the eight circuit units has been described. Uniformity of magnetic field distribution between the circuit units is improved when the number of the circuit units is three or more. Therefore, the number of the circuit units can be optional as long as the number is three or more.

Third Embodiment

A semiconductor device according to the present embodiment is similar to the first embodiment except for that a circuit component is provided between adjacent circuit units. Therefore, a description for the matters overlapping with the first embodiment will be partly omitted.

Figure 8:
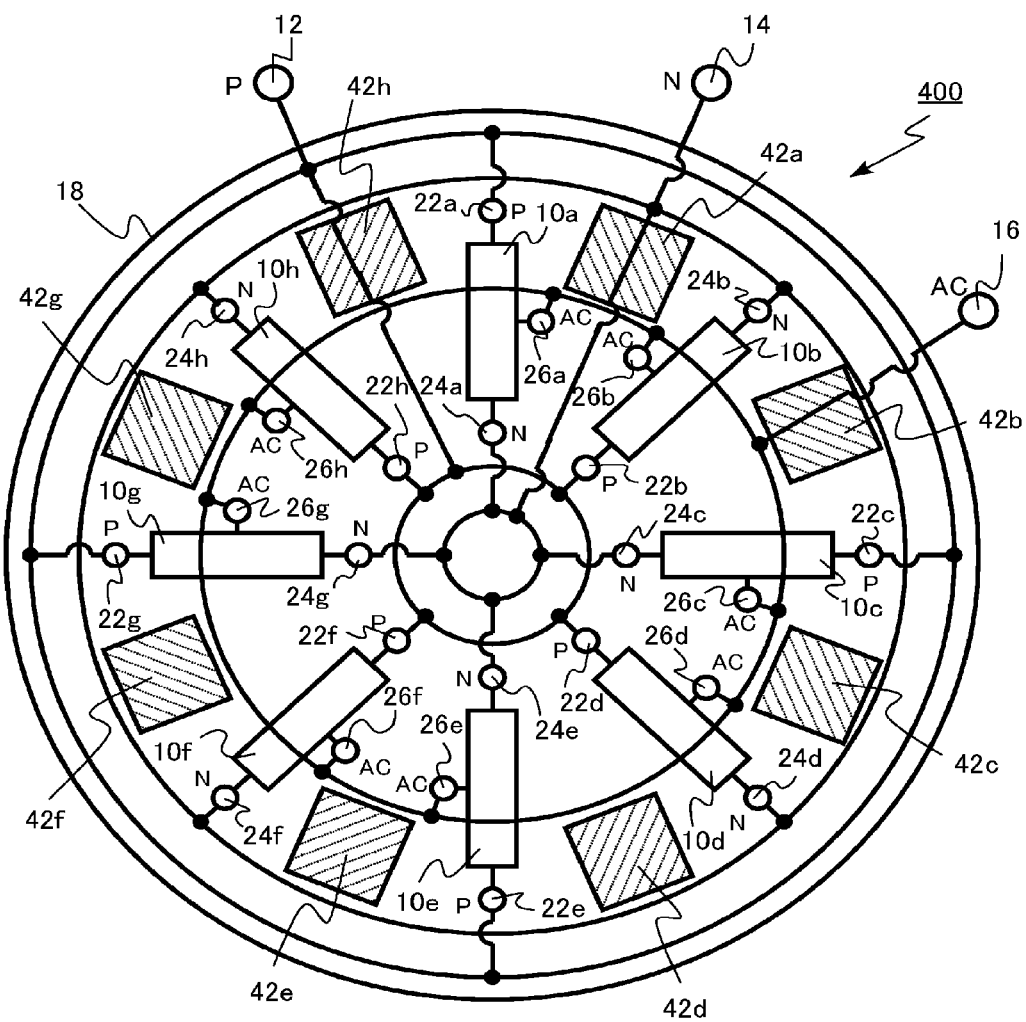
FIG. 8 is a schematic plan view illustrating a semiconductor device according to a third embodiment.

FIG. 8 is a schematic plan view illustrating the semiconductor device according to the present embodiment. The semiconductor device according to the present embodiment is a semiconductor module used in an inverter circuit.

In a semiconductor module 400 according to the present embodiment, circuit components 42a to 42h are provided between the adjacent circuit units respectively. For example, attention is focused on the circuit unit 10a and the circuit unit 10b adjacent to each other. The circuit component 42a is provided between the circuit unit 10a and the circuit unit 10b. Each of the circuit components 42b to 42h is also provided between other two of the adjacent circuit units in the similar manner.

The circuit components 42a to 42h are components of an inverter circuit such as a gate drive circuit, a capacitor, and an inductor.

In the semiconductor module 400, the circuit components 42a to 42h are arranged in respective empty spaces between the circuit units 10a to 10h by arranging the circuit units 10a to 10h in a circle shape. Therefore, the inverter circuit using the semiconductor module can be downsized.

According to the present embodiment, uniformity of current distribution between the circuit units is improved and manufacturing cost of the semiconductor module can be reduced similar to the first embodiment. Further, breakdown of an element and noise generation can be suppressed. Furthermore, inverter circuit using the semiconductor module can be downsized.

Fourth Embodiment

A semiconductor device according to the present embodiment differs from a first embodiment in that circuit units are arranged in a manner such that directions to respectively connect first electrodes to second electrodes of the circuit units become substantially parallel. A description for the matters overlapping with the first embodiment will be partly omitted.

Figure 9A:
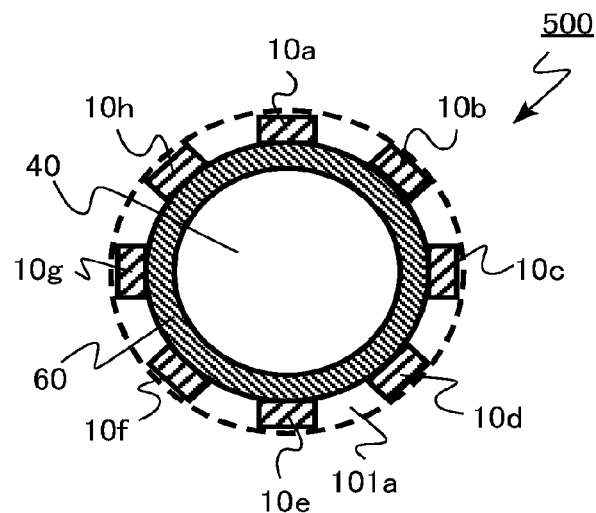
FIGS. 9A and 9B are schematic perspective views illustrating a driving device according to a fourth embodiment.
Figure 9B:
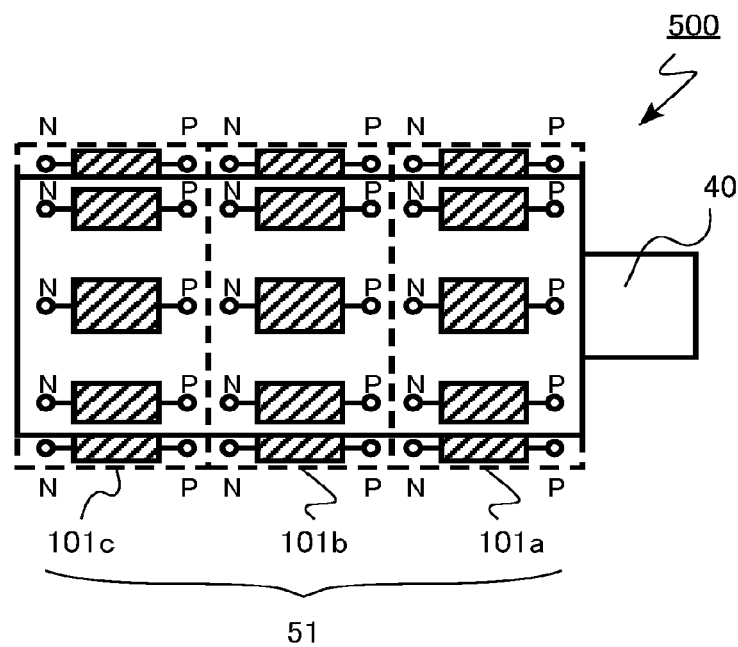

FIGS. 9A and 9B are schematic views illustrating a driving device including the semiconductor device according to the present embodiment. FIG. 9A is the schematic cross-sectional view, and FIG. 9B is the schematic side view.

A driving device 500 includes a motor 40, a water-cooling mechanism 60, and an inverter circuit 51. Semiconductor modules 101a, 101b, 101c constituting the inverter circuit 51 are the semiconductor devices according to the present embodiment.

The water-cooling mechanism 60 is provided around the motor 40. The water-cooling mechanism 60 has a function to cool the motor 40.

The inverter circuit 51 is provided around the motor 40. The inverter circuit 51 is provided along a side surface of the water-cooling mechanism 60. Meanwhile, the inverter circuit 51 may be provided in an area between the motor 40 and the water-cooling mechanism 60.

The inverter circuit 51 is formed of the three semiconductor modules 101a, 101b, 101c. The three semiconductor modules 101a, 101b, 101c are connected in parallel between a first main electrode and a second main electrode, thereby implementing the three-phase inverter circuit 51 including three AC voltage output terminals U, V, W. The motor 40 is driven by AC voltage output from the inverter circuit 51.

The semiconductor modules 101a, 101b, 101c include circuit units 10a to 10h respectively. The circuit units 10a to 10h are arranged in an annular shape along a side surface of a water-cooling mechanism 60. Further, the circuit units are arranged in a manner such that the directions to connect the first electrodes and the second electrodes of the respective circuit units 10a to 10h become substantially parallel. In other words, the circuit units 10a to 10h are horizontally arranged in an aligned manner on the side surface of the water-cooling mechanism 60.

In the semiconductor modules 101a, 101b, 101c according to the present embodiment, all of the circuit units 10a to 10h are respectively affected by magnetic fluxes of two circuit units located on both sides thereof in the similar manner. Therefore, uniformity of magnetic field distribution between the circuit units 10a to 10h is improved, and uniformity of current distribution between the circuit units 10a to 10h is improved.

Therefore, uniformity of current distribution between the circuit units is improved, and manufacturing cost of the semiconductor module can be reduced similar to the first embodiment. Moreover, inductance is reduced and breakdown of an element and noise generation can be suppressed by dividing the semiconductor module into the plurality of circuit units.

The manufacturing cost can also be reduced in the inverter circuit 51 and the driving device 500. Further, breakdown of an element and noise generation can be suppressed. Moreover, since the respective semiconductor module 101a, 101b, 101c constituting the inverter circuit 51 are arranged in an annular shape along the side surfaces of the motor 40 and the water-cooling mechanism 60, the driving device 500 can be downsized.

Fifth Embodiment

A vehicle according to the present embodiment is a vehicle including a semiconductor device according to a first embodiment.

Figure 10:
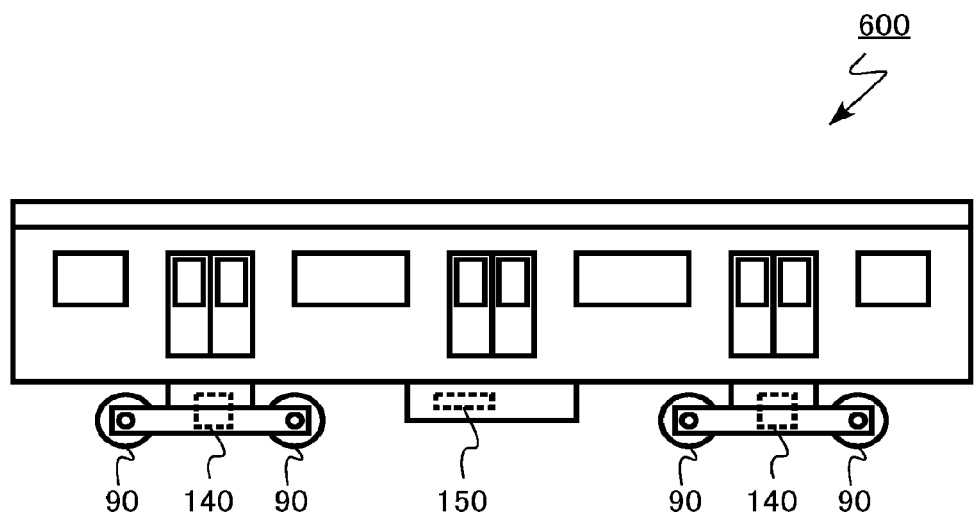
FIG. 10 is a schematic diagram illustrating a vehicle according to a fifth embodiment.

FIG. 10 is a schematic diagram illustrating the vehicle according to the present embodiment. A vehicle 600 according to the present embodiment is a railway vehicle. The vehicle 600 includes a motor 140 and an inverter circuit 150.

The inverter circuit 150 is formed of three semiconductor modules having a structure the same a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. A wheel 90 of the vehicle 600 is rotated by the motor 140.

The vehicle 600 according to the present embodiment includes the inverter circuit 150 in which uniformity of current distribution is improved between circuit units and breakdown of an element and noise generation are suppressed, thereby reducing manufacturing cost and providing high reliability.

Sixth Embodiment

A vehicle according to the present embodiment is a vehicle including a semiconductor device according to a first embodiment.

Figure 11:
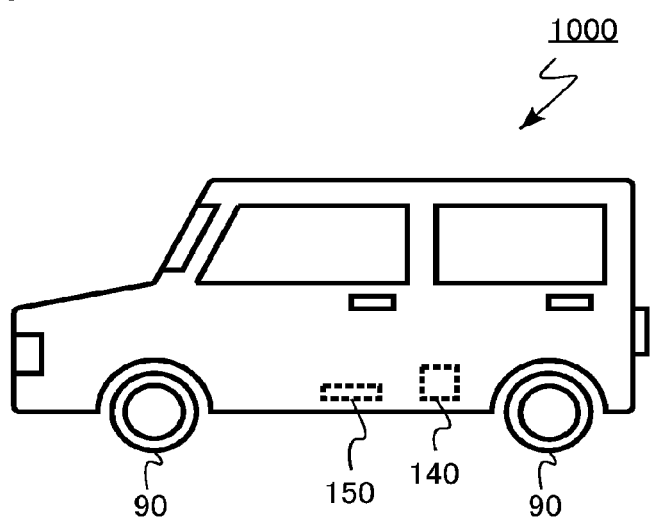
FIG. 11 is a schematic diagram illustrating a vehicle according to a sixth embodiment.

FIG. 11 is a schematic diagram illustrating a vehicle according to the present embodiment. A vehicle 1000 according to the present embodiment is an automobile. The vehicle 1000 includes a motor 140 and an inverter circuit 150.

The inverter circuit 150 is formed of three semiconductor modules having a structure the same as a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. A wheel 90 of the vehicle 1000 is rotated by the motor 140.

The vehicle 1000 according to the present embodiment includes the inverter circuit 150 in which uniformity of current distribution is improved between circuit units and breakdown of an element and noise generation are suppressed, thereby reducing manufacturing cost and providing high reliability.

Seventh Embodiment

An elevator according to the present embodiment is an elevator including a semiconductor device according to a first embodiment.

Figure 12:
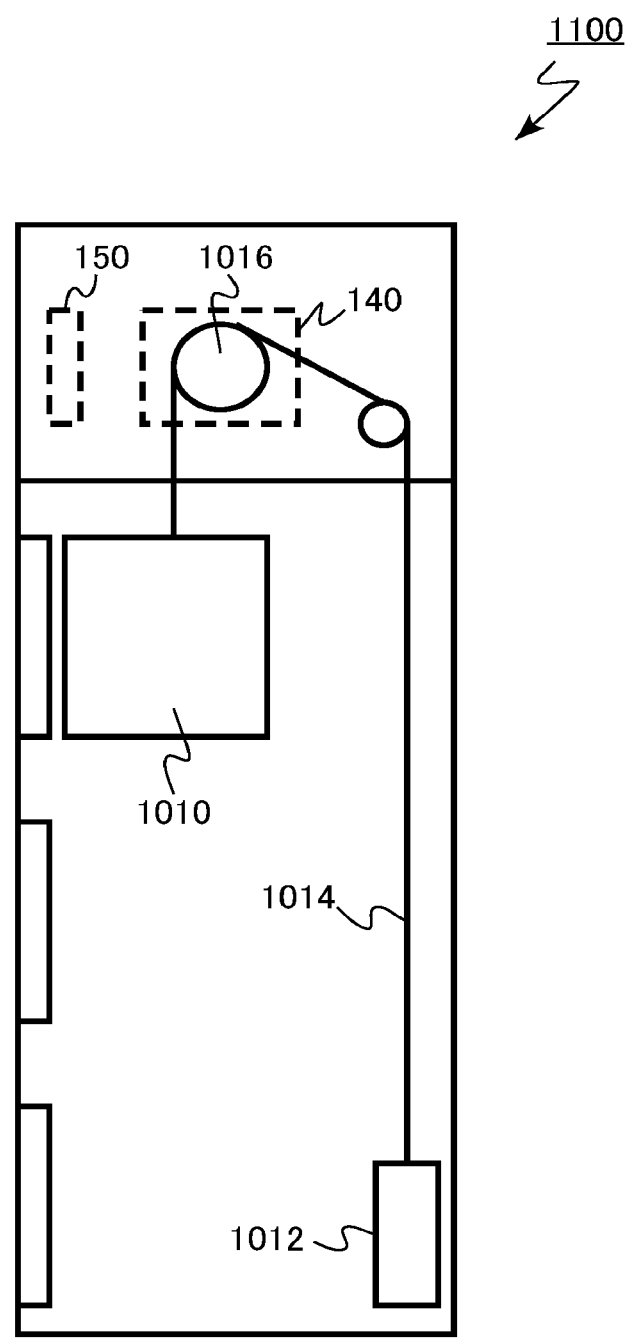
FIG. 12 is a schematic diagram illustrating an elevator according to a seventh embodiment.

FIG. 12 is a schematic diagram of the elevator according to the present embodiment. An elevator 1100 according to the present embodiment includes a basket 1010, a counterweight 1012, a wire rope 1014, a winding machine 1016, a motor 140, and an inverter circuit 150.

The inverter circuit 150 is formed of three semiconductor modules having a structure the same as a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. The winding machine 1016 is rotated by the motor 140, and the basket 1010 is moved up and down.

The elevator 1100 according to the present embodiment includes the inverter circuit 150 in which uniformity of current distribution is improved between circuit units and breakdown of an element and noise generation are suppressed, thereby reducing manufacturing cost and providing high reliability.

Eighth Embodiment

A semiconductor device according to the present embodiment includes a plurality of circuit units, and each of the circuit units includes: a first electrode; a second electrode; a first switching element and a second switching element electrically connected in series between the first electrode and the second electrode; and a third electrode connected between the first switching element and the second switching element. Further, the circuit units are arranged in a fan-like shape. In other words, line segments that respectively connect the first electrodes to the second electrodes in the respective circuit units intersect on the same side of the circuit units.

Figure 13:
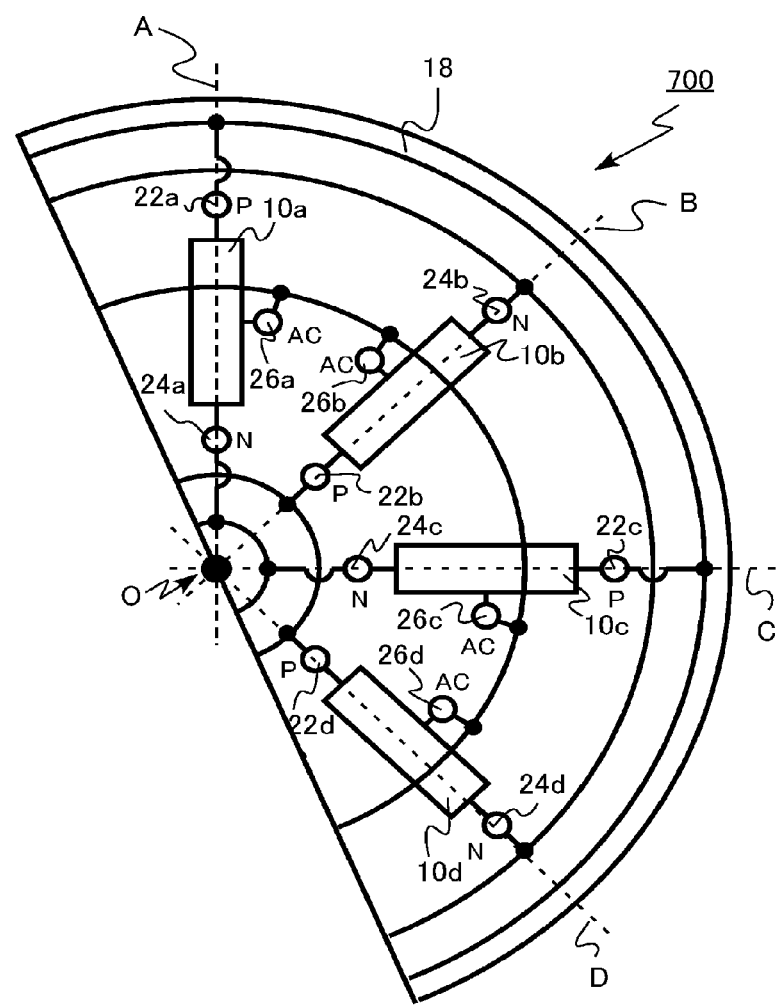
FIG. 13 is a schematic plan view of a semiconductor device according to an eighth embodiment.

FIG. 13 is a schematic plan view illustrating the semiconductor device according to the present embodiment. The semiconductor device according to the present embodiment is a semiconductor module 700 used in an inverter circuit. The semiconductor module according to the present embodiment is a semiconductor module obtained by dividing a semiconductor module 100 of a first embodiment into two.

The semiconductor module 700 includes a plurality of circuit units 10a to 10d and a substrate 18. Further, the circuit units 10a to 10d include the first electrodes 22a to 2d, second electrodes 24a to 24d, and AC electrodes 26a to 26d respectively. Further, the circuit units 10a to 10d respectively include gate signal terminals not illustrated.

The circuit units 10a to 10d are arranged in a fan-like shape. Line sections A, B, C, D that respectively connect the first electrodes 22a to 2d to the second electrodes 24a to 24d of the circuit units 10a to 10d intersect on the same side of the circuit units 10a to 10d. For example, the line sections A, B, C, D intersect at a single point (O in FIG. 11).

The semiconductor module 100 according to the first embodiment can be manufacturing by combining two of the semiconductor modules 700. Therefore, uniformity of current distribution between the circuit units is improved by combining the semiconductor modules of the present embodiment, and the semiconductor module can be manufactured at reduced manufacturing cost. Further, inductance is reduced and breakdown of an element and noise generation can be suppressed by dividing the semiconductor module into the plurality of circuit units.

While the exemplary case of dividing the semiconductor module 100 of the first embodiment into two has been described, it is also possible to have an embodiment in which the semiconductor module 100 is divided into three or four, for example. Further, an embodiment in which a semiconductor module 300 of a second embodiment is divided may also be applied.

Meanwhile, in the case where the line sections A, B, C, D intersect at one point ("O" in FIG. 13) like the present embodiment, the semiconductor module manufactured by combination comes to have an embodiment in which the circuit units are arranged in a circle shape.

As described above, in the first to eighth embodiments, the example in which the first switching element and the second switching element are the MOSFETs has been described, but an insulated gate bipolar transistor (IGBT), a high electron mobility transistor (HEMT), and the like are also applicable.

Further, in the first to eighth embodiments, the example of applying silicon carbide (SiC) as semiconductor material of the first switching element and the second switching element has been described, but silicon (Si), gallium nitride (GaN), and the like are also applicable.

Further, in the fifth to seventh embodiments, the exemplary cases of applying the semiconductor device according to the present disclosure to the vehicle and the elevator have been described, but the semiconductor device of the present disclosure is also applicable to, for example, a power conditioner of a solar power system and the like.

While certain embodiments have been described, these embodiments have been presented by way of example only, and are not intended to limit the scope of the inventions. Indeed, the semiconductor device, the inverter circuit, the driving device, a vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising a plurality of circuit units, each of the circuit units including:
   a first electrode;
   a second electrode;
   a first switching element and a second switching element electrically connected in series between the first electrode and the second electrode; and
   a third electrode electrically connected between the first switching element and the second switching element,
   wherein the circuit units are arranged in an annular shape, and
   wherein in two adjacent circuit units of the circuit units, the first electrode of one circuit unit of the two adjacent circuit units and the second electrode of the other circuit unit of the two adjacent circuit units are adjacent to each other and the second electrode of the one circuit unit and the first electrode of the other circuit unit are adjacent to each other.

2. The semiconductor device according to claim 1, wherein each of the circuit units further includes a capacitor electrically connected between the first electrode and the second electrode, the capacitor electrically connected in parallel to the first switching element and the second switching element.

3. The semiconductor device according to claim 1, wherein each of the first electrodes are mutually connected, each of the second electrodes are mutually connected, and each of the third electrodes are mutually connected.

4. The semiconductor device according to claim 1, wherein the circuit units are arranged such that directions to respectively connect the first electrode to the second electrode of each of the circuit units become radial.

5. The semiconductor device according to claim 1, wherein the circuit units are arranged such that directions to respectively connect the first electrode to the second electrode of each the circuit units become substantially parallel.

6. The semiconductor device according to claim 1, further including a substrate, wherein the plurality of circuit units is arranged on the substrate.

7. The semiconductor device according to claim 4, wherein a circuit component is provided between two adjacent circuit units of the circuit units.

8. The semiconductor device according to claim 1, wherein the first switching element and the second switching element are MOSFETs or IGBTs.

9. An inverter circuit including a semiconductor device according to claim 1.

10. A driving device including a semiconductor device according to claim 1.

11. A vehicle including a semiconductor device according to claim 1.

12. An elevator including a semiconductor device according to claim 1.

13. A semiconductor device comprising a plurality of circuit units, each of the circuit units including:
a first electrode;
a second electrode;
a first switching element and a second switching element electrically connected in series between the first electrode and the second electrode; and
a third electrode electrically connected between the first switching element and the second switching element,
wherein the circuit units are arranged in an annular shape, and
wherein the circuit units are arranged such that directions to respectively connect the first electrode to the second electrode of each the circuit units become substantially parallel.

14. A semiconductor device comprising a plurality of circuit units, each of the circuit units including:
a first electrode;
a second electrode;
a first switching element and a second switching element electrically connected in series between the first electrode and the second electrode; and
a third electrode electrically connected between the first switching element and the second switching element,
wherein the circuit units are arranged in an annular shape,
and wherein the circuit units are arranged such that directions to respectively connect the first electrode to the second electrode of each of the circuit units become radial, and
wherein a circuit component is provided between two adjacent circuit units of the circuit units.

* * * * *